United States Patent
Morimoto et al.

(10) Patent No.: US 9,666,396 B2
(45) Date of Patent: May 30, 2017

(54) ELECTROMAGNETIC INDUCTIVE LOAD CONTROL DEVICE

(71) Applicant: YAZAKI CORPORATION, Minato-ku, Tokyo (JP)

(72) Inventors: Mitsuaki Morimoto, Shizuoka (JP); Eiichiro Oishi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 231 days.

(21) Appl. No.: 14/748,317

(22) Filed: Jun. 24, 2015

(65) Prior Publication Data

US 2015/0294822 A1    Oct. 15, 2015

Related U.S. Application Data

(63) Continuation of application No. PCT/JP2013/082049, filed on Nov. 28, 2013.

(30) Foreign Application Priority Data

Dec. 27, 2012 (JP) ................................. 2012-285019

(51) Int. Cl.
- *H01H 47/32* (2006.01)
- *H03K 17/16* (2006.01)
- *H01H 50/16* (2006.01)

(52) U.S. Cl.
CPC .......... *H01H 47/325* (2013.01); *H01H 50/16* (2013.01); *H03K 17/165* (2013.01)

(58) Field of Classification Search
CPC ....... H01H 47/00; H01H 47/325; H01H 50/16
(Continued)

(56) References Cited

U.S. PATENT DOCUMENTS 5,012,381 A * 4/1991 Elliott .................. H02H 7/0833
                                                        320/165
5,018,366 A   5/1991 Tanaka et al.
(Continued)

FOREIGN PATENT DOCUMENTS

EP    1381060 A1    1/2004
EP    2284858 A1    2/2011
(Continued)

OTHER PUBLICATIONS

Search Report issued on Jul. 27, 2016 in the counterpart European application.
(Continued)

*Primary Examiner* — Stephen W Jackson
*Assistant Examiner* — Christopher Clark
(74) *Attorney, Agent, or Firm* — Mots Law, PLLC (57) ABSTRACT

With a relay control device according to an embodiment, a regenerative current from a relay coil which is disposed in a relay flows through a coil energy absorption circuit, which is connected to the low side of the relay coil, toward the ground. A current detection resistor, which is a shunt resistor, is connected further toward the ground side of the coil energy absorption circuit than a coil surge absorption resistor, and the potential of the current detection resistor is compared to a reference potential, with a current detection circuit. Furthermore, on the basis of the result of the comparison with the current detection circuit, an off-duty period of the PWM control is terminated before the current which flows through the relay coil becomes less than or equal to a minimum drive current.

2 Claims, 5 Drawing Sheets

(58) Field of Classification Search
USPC .................................................. 361/159, 160
See application file for complete search history.

(56) References Cited

U.S. PATENT DOCUMENTS

| | | | | |
|---|---|---|---|---|
| 5,195,016 A | * | 3/1993 | Powers | H01H 47/24 |
| | | | | 315/159 |
| 5,953,198 A | * | 9/1999 | Murata | H01H 47/002 |
| | | | | 361/152 |
| 6,674,628 B1 | * | 1/2004 | Wohlfarth | H01H 47/325 |
| | | | | 361/152 |
| 7,336,470 B2 | * | 2/2008 | Satoh | H01F 7/18 |
| | | | | 361/152 |
| 7,433,171 B2 | * | 10/2008 | Vincent | H01F 7/18 |
| | | | | 361/139 |
| 8,625,249 B2 | * | 1/2014 | Ooishi | H02M 3/156 |
| | | | | 361/139 |
| 8,680,717 B2 | * | 3/2014 | Morimoto | H01H 47/325 |
| | | | | 307/116 |
| 2002/0109477 A1 | * | 8/2002 | Ikezawa | H02M 3/158 |
| | | | | 318/727 |
| 2004/0120094 A1 | * | 6/2004 | Satoh | H01F 7/18 |
| | | | | 361/160 |
| 2005/0105239 A1 | * | 5/2005 | Satoh | H01F 7/1844 |
| | | | | 361/139 |
| 2006/0007628 A1 | * | 1/2006 | Rembold | F02D 41/20 |
| | | | | 361/160 |
| 2011/0109168 A1 | * | 5/2011 | Morimoto | H01H 47/325 |
| | | | | 307/104 |
| 2012/0319499 A1 | | 12/2012 | Ooishi et al. | |

FOREIGN PATENT DOCUMENTS

| | | |
|---|---|---|
| JP | H01-203667 A | 8/1989 |
| JP | H09-100938 A | 4/1997 |
| JP | 2000-223313 A | 8/2000 |
| JP | 2001-132866 A | 5/2001 |
| JP | 2001-263531 A | 9/2001 |
| JP | 2002-000670 A | 1/2002 |
| JP | 2002-208849 A | 7/2002 |
| JP | 2004-335656 A | 11/2004 |
| JP | 2011-188226 A | 9/2011 |
| JP | 2012-210135 A | 10/2012 |

OTHER PUBLICATIONS

Office Action issued on Jan. 31, 2017 in the counterpart Japanese application.

* cited by examiner

ELECTROMAGNETIC INDUCTIVE LOAD CONTROL DEVICE

CROSS REFERENCE TO RELATED APPLICATIONS

This application is a continuation of International Application No. PCT/JP2013/082049, filed Nov. 28, 2013, and based upon and claims the benefit of priority from Japanese Patent Application No. 2012-285019, filed Dec. 27, 2012, the entire contents of all of which are incorporated herein by reference.

TECHNICAL FIELD

This application relates to a device for controlling an electromagnetic inductive load, such as relay coil and electromagnetic clutch.

BACKGROUND ART

For the purpose of reducing power consumption or heat generation, PWM control is adopted to supply an electromagnetic inductive load, such as relay coil and electromagnetic clutch, with power from a power source. Then, during a power-off period of PWM control where the power supply from the power source to the electromagnetic inductive load is turned off, regeneration current flows. By switching power-off to power-on of PWM control to restart the power supply to the electromagnetic inductive load before the regeneration current flows below a minimum value of current required to drive the electromagnetic inductive load, it is possible to reduce power consumption or heat generation while maintaining the driving of the electromagnetic inductive load.

In the case of performing PWM control mentioned above, it is indispensable to detect a regeneration current value flowing through the electromagnetic inductive load in order to determine an appropriate timing of switching the power supply from the power source to the electromagnetic inductive load from its on-state to off-state. In the past, therefore, inventors of the present application et al. proposed an electromagnetic inductive load control device configured to allow the regeneration current to flow through a shunt resistor via a diode to detect a regeneration current value from a potential difference between both ends of the shunt resistor and control power-on in PWM control based on the detected regeneration current value (refer to JP 2011-188226 A).

In the control device according to this proposal, the potential on an anode side of the diode becomes higher than the potential of the power source. Therefore, drop circuits for voltage drop are provided at both ends of the shunt resistor respectively to protect a detection part for detecting the potential difference between both ends of the shunt resistor from a high voltage potential.

SUMMARY

In the control device according to the above-mentioned proposal, it is necessary to use, as a diode, a high-speed diode whose reverse recovery time is short, so that the route of current flowing through the shunt resistor is switched synchronously with the turning on and off of the power supply from the power source to the electromagnetic inductive load with no delay. Additionally, as voltage exceeding the source voltage is inputted to a current detection circuit, there is need of providing a drop circuit for reducing the input voltage to the source voltage or lower for the purpose of protecting the circuit from high voltage. The necessity of these elements causes the production cost of the device to soar.

In the control device according to the above-mentioned proposal, if it is required to turn off the drive of the electromagnetic inductive load at high speed in response to a stoppage of power supply from the power source, it is desirable to turn off a switching element connected in series with the high-speed diode at the same time of turning off the power supply from the power source, thereby opening a route of the regenerative current flowing from the electromagnetic inductive load via the high-speed diode and the shunt resistor back to the electromagnetic inductive load.

In the control device according to the above-mentioned proposal, the coil current during the power-off period of PWM control is a regenerative current due to energy stored in the relay coil during the power-on period of PWM control, which current is then supplied to the relay coil via the high-speed diode and the switching element. Therefore, no current is supplied from the power source to the relay coil during the power-off period of PWM control, so that the current supplied from the power source to the relay coil becomes a pulsed current. Such a pulsed current contains high-frequency components which may cause an occurrence of noise. Thus, there is newly generated a need of taking measures against EMI (Electro-Magnetic Interference) around the power source.

Under such a situation as mentioned above, an object of the present invention is to provide an electromagnetic inductive load control device which allows a regenerative current flowing through an electromagnetic inductive load to be detected with its simple constitution and which can suppress an occurrence of noises during driving operation of the electromagnetic inductive load under PWM control.

In order to attain the above object, according to a first aspect of the present invention, there is provided an electromagnetic inductive load control device for PWM-controlling power supply to an electromagnetic inductive load by performing ON and OFF control of a PWM-control switching element connected to a lower side of the electromagnetic inductive load to which electrical power from a power source is supplied, including: a series circuit having a high-impedance surge-voltage absorption resistor and a low-impedance regenerative-current detection resistor, the series circuit being connected to the lower side of the electromagnetic inductive load in parallel with the PWM-control switching element and allowing regenerative current from the electromagnetic inductive load to flow through the surge-voltage absorption resistor and the regenerative-current detection resistor in series; a regenerative-current control switching element connected in series with a point of the series circuit through which the regenerative current passing through at least the surge-current detection resistor flows; and a drive circuit that turns on the regenerative-current control switching element while supplying the electromagnetic inductive load with the electrical power and that turns off the regenerative-current control switching element with the completion of supplying the electromagnetic inductive load with the electrical power.

With the above constitution, under PWM control of the electromagnetic inductive load, the regenerative current generated from the electromagnetic induct inductive load flows to the ground through the series circuit composed of the surge-voltage absorption resistor and the regenerative-current detection resistor with the PWM control switching element turned off and the regenerative-current control switching element turned on.

Then, due to voltage drop at the surge-voltage absorption resistor, the voltage applied to the regenerative-current detection resistor is remarkably lowered in comparison with the surge voltage. Thus, a circuit element for detecting a regenerative-current value based on a potential difference between both ends of the regenerative-current detection resistor is prevent from being damaged by high voltage.

Under PWM control, additionally, during a power-on period of the PWM control switching element producing no regenerative current, current accompanied with the power supply for the electromagnetic inductive load does not flow into the series circuit where the regenerative current is flowing. Additionally, as the series circuit allowing a flowage of the regenerative current is connected to the lower side of the electromagnetic inductive load, it becomes the ground potential when the regenerative-current control switching element is turned on. Therefore, even if the regenerative-current control switching element is turned on, there is no possibility that short-circuit current flows through the element. Thus, there is no need of providing a high-speed diode whose reverse recovery time is short, in the series circuit.

For this reason, the regenerative current flowing through the electromagnetic inductive load can be led to the ground with the simple structure such the series circuit including the surge-voltage absorption resistor and the regenerative-current detection resistor voltage connected to the ground. Consequently, since the voltage inputted to the current detection circuit becomes less than the source voltage to eliminate the need for a drop circuit for reducing the input voltage less than the source voltage, the circuit of an inductive load can be constructed at lower cost.

The electromagnetic inductive load may be a relay coil provided in a relay, and the drive circuit may be configured to turn on the regenerative-current control switching element synchronously with the power-on period by DC drive of the PWM-control switching element when the relay is turned on with the start of supplying the electromagnetic inductive load with the electrical power and to turn off the regenerative-current control switching element synchronously with the PWM-control switching element's turned off when the relay is turned off with the completion of supplying the electromagnetic inductive load with the electrical power.

With this constitution, if turning off the regenerative-current control switching element synchronously with the stoppage of power supply from the power source to the relay coil, then the route of regenerative current flowing from the relay coil and passing through the surge-voltage absorption resistor and the regenerative-current detection resistor is opened, so that the relay is turned off at high speed.

Here, it is noted that the regenerative current from the relay coil under PWM control flows to the ground through the series circuit having the surge-voltage absorption resistor and the regenerative-current detection resistor and does not flow into the power source, in the form of charging current. For this reason, even during the power-off period of PWM control, the discharge of the power source is not interrupted by the regenerative current from the relay coil, so that the discharge current is maintained almost constant. Thus, the discharge current of the power source is prevented from varying so as to contain high-frequency components causing noises.

Accordingly, it is possible to prevent the discharge current of the power source from pulsating and containing high-frequency components so that there arises a need for measures against EMI (Electro-Magnetic Interference) around the power source.

With the electromagnetic inductive load control device according to the first aspect of the present invention, the regenerative current flowing through an electromagnetic inductive load can be detected with its simple constitution and additionally, it is possible to suppress an occurrence of noises during driving operation of the electromagnetic inductive load under PWM control.

DESCRIPTION OF EMBODIMENTS

Figure 1:
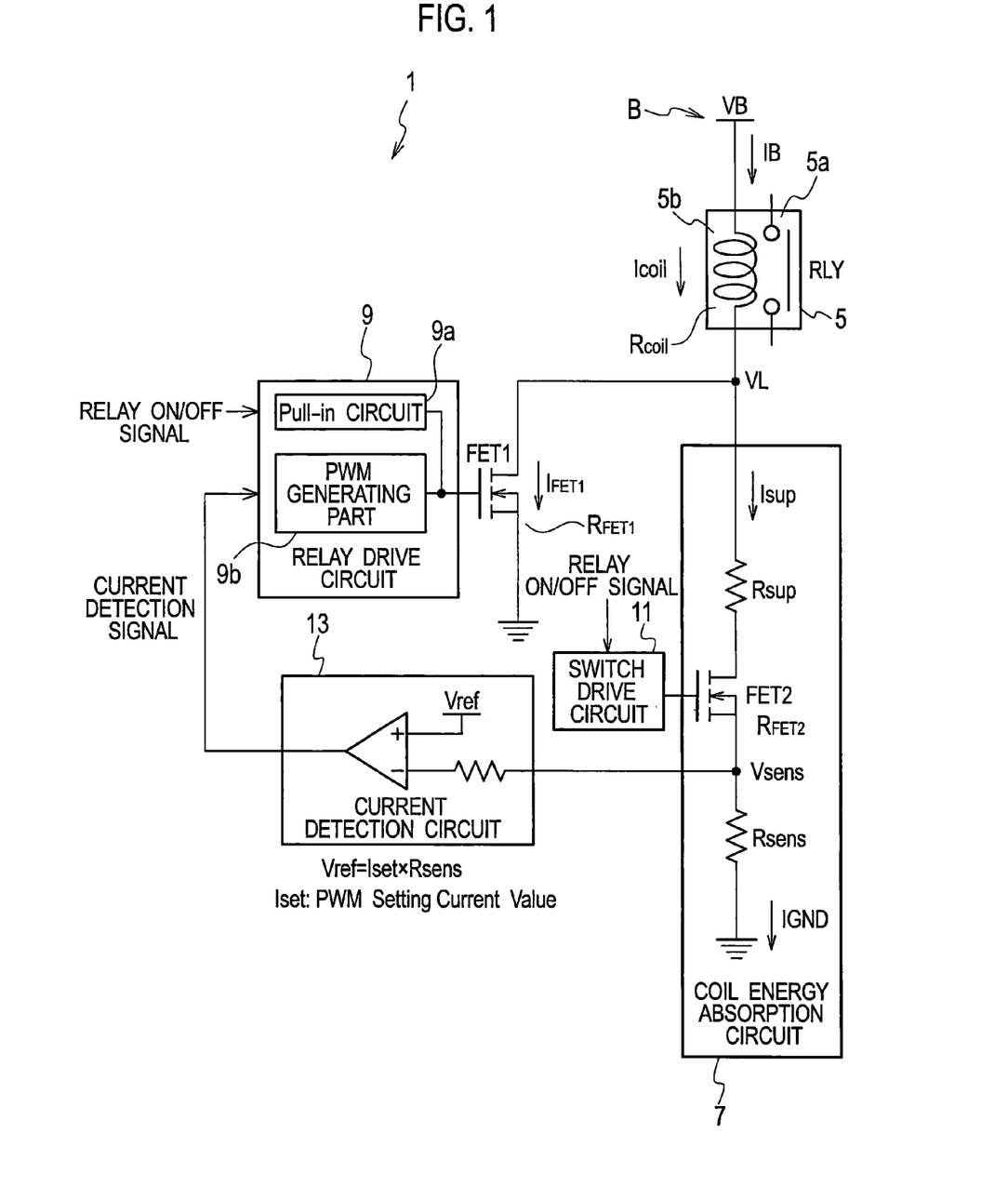
FIG. 1 is a circuit diagram illustrating the fundamental constitution of a relay control device according to an embodiment.

An embodiment will be described with reference to drawings, below. FIG. 1 is a circuit diagram illustrating the fundamental constitution of a relay control device 1 according to the embodiment.

For instance, the relay control device (electromagnetic inductive load control device) 1 is used for power-on control of a relay coil (electromagnetic inductive load) 5b to open and close a relay contact 5a of a relay 5 to switch on and off the power supply from a power source B, such as a vehicle battery, to a load (not illustrated) such as a travelling system and a lighting system of a vehicle.

The relay control device 1 includes an FET1 as a first MOSFET (field-effect transistor) (PWM control switching element) of N-channel type which turns on/off the energization of a relay coil 5b, a coil energy absorption circuit 7, a relay drive circuit 9, a switch drive circuit 11 and a current detection circuit 13.

The coil energy absorption circuit 7 constitutes a route for allowing a regenerative current, which has been generated by the relay coil 5b during the power-off period by PWM control of the relay drive circuit 9, to flow against the ground, and is connected to the low side of the relay 5.

The coil energy absorption circuit 7 is constituted by a series circuit which includes an FET2 as an "N-channel type" second MOSFET (field effect transistor) (regenerative-current control switching element) to be turned on and off in synchronization with on and off of the relay contact 5a on the route of the regenerative current, a coil surge absorption resistor (surge voltage absorption resistor) Rsup for dropping a surge voltage generated at the first throw-off of an occurrence of the regenerative current to protect the FET2, and a current detection resistor (regenerative current detecting resistor) Rsens used as a shunt resistor for monitoring a current Icoil flowing through the relay coil 5b.

The coil surge absorption resistor Rsup is connected to a drain of the FET2, while a source of the FET2 is connected to one end of a current detection resistor Rsens. The other end of the current detection resistor Rsens is connected to the ground.

The relay drive circuit 9 is a circuit that controls the energization for the relay coil 5*b* through a switching of the FET1. Inputted to the relay drive circuit 9 are a relay-on signal and a relay-off signal which are outputted from a relay driving signal source (not illustrated) to turn on (drive) the relay 5 and turn off (stop) the relay 5, respectively.

A current detection signal from the current detection circuit 13 is inputted to the relay drive circuit 9. The current detection signal is generated by the current detection circuit 13 when a current Icoil flowing through the relay coil 5*b* drops down to a minimum drive current necessary to keep the relay contact 5*a* activated. The relay drive circuit 9 includes a Pull-in circuit 9*a* and a PWM generating part 9*b*.

When the relay-on signal from a relay drive signal source (not illustrated) is inputted to the Pull-in circuit 9*a*, the Pull-in circuit 9*a* outputs a DC drive signal (Pull-in) for turning on the FET1 to a gate of the FET1 for a predetermined period. The predetermined period to output the DC drive signal (Pull-in) is set to enough time for the relay contact 5*a* to be closed by the energization start of the relay coil 5*b*.

When the current detection signal from the current detection circuit 13 is inputted to the PWM generating part 9*b*, the PWM generating part 9*b* outputs a PWM drive signal for turning on the FET1 to the gate of the FET1 for a period corresponding to the on-duty period of PWM control for turning on the FET1.

The switch drive circuit (drive circuit) 11 is a circuit that controls the supply of the regenerative current of the relay coil 5*b* to the coil energy absorption circuit 7 through the switching of the FET2. Inputted to the switch drive circuit 11 are a relay-on signal and a relay-off signal which are outputted from a relay driving signal source (not illustrated).

When the relay-on signal is inputted to the switch drive circuit 11, the switch drive circuit 11 starts to output an absorption circuit ON signal for turning on the FET2 of the coil energy absorption circuit 7 to a gate of the FET2. When the relay OFF signal is inputted, the switch drive circuit 11 completes the outputting of the absorption circuit ON signal to the gate of the FET2

The current detection circuit 13 is formed by a comparator. A reference potential Vref is inputted to a non-inverting input terminal of the current detection circuit 13. Inputted to an inverting input terminal of the current detection circuit 13 is a potential Vsens which appears at a connection point between the source of the FET2 of the coil energy absorption circuit 7 and the current detection resistor Rsens. The potential Vsens becomes a potential of the current detection resistor Rsens on the basis of the ground potential. If the potential Vsen of the current detection resistor Rsens becomes equal to or less than the reference potential Vref, the current detection circuit 13 outputs a current detection signal.

The value of the reference potential Vref is set to the potential Vsens (=Iset×Rsens) of the current detection resistor Rsens when the current Icoil flowing through the relay coil 5*b* is the minimum drive current Iset for turning on the relay contact 5*a*. Therefore, when the current Icoil of the relay coil 5*b* is equal to or less than the minimum driving current Iset, the current detection signal is outputted from the current detection circuit 13.

Incidentally, the potential of the coil surge absorption resistor Rsup on the side of the ground becomes higher than the source voltage VB due to a surge voltage generated with the switching of the relay contact 5*a* from its on-state to off-state. In the embodiment, therefore, the FET2 where the current corresponding to the potential difference between its gate and the source flows between the drain and the source is connected between the coil surge absorption resistor Rsup and the current detection resistor Rsens. As a result, the current detection circuit 13 whose inverting input terminal is connected to the connection point between the source of the FET2 and the current detection resistor Rsens is protected from high voltage.

Figure 2:
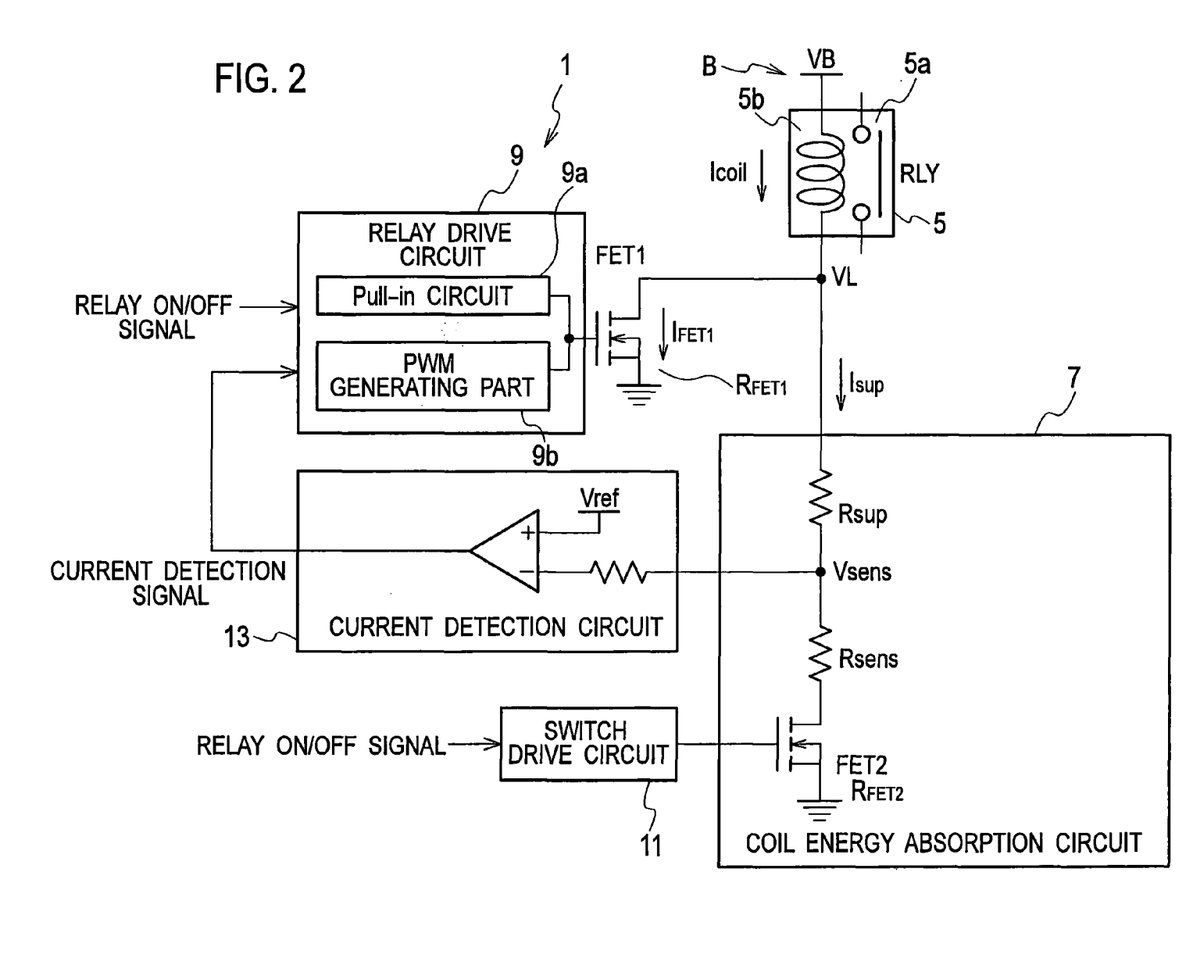
FIG. 2 is a circuit diagram illustrating the fundamental constitution of a relay control device according to a modification of the embodiment.

However, if the current detection circuit 13 has a sufficient resistance against a high voltage exceeding the source voltage VB, the current detection resistor Rsens may be connected to the coil surge suppression resistor Rsup and the FET2 may be connected between the current detection resistor Rsens and the ground, as illustrated in the circuit diagram of FIG. 2.

Next, the operation (action) of the relay control unit 1 constructed like FIG. 1 will be described with reference to potentials, currents, and signal states at respective points of the relay control device 1 illustrated with respective charts (a)~(g) of FIG. 3.

Figure 3:
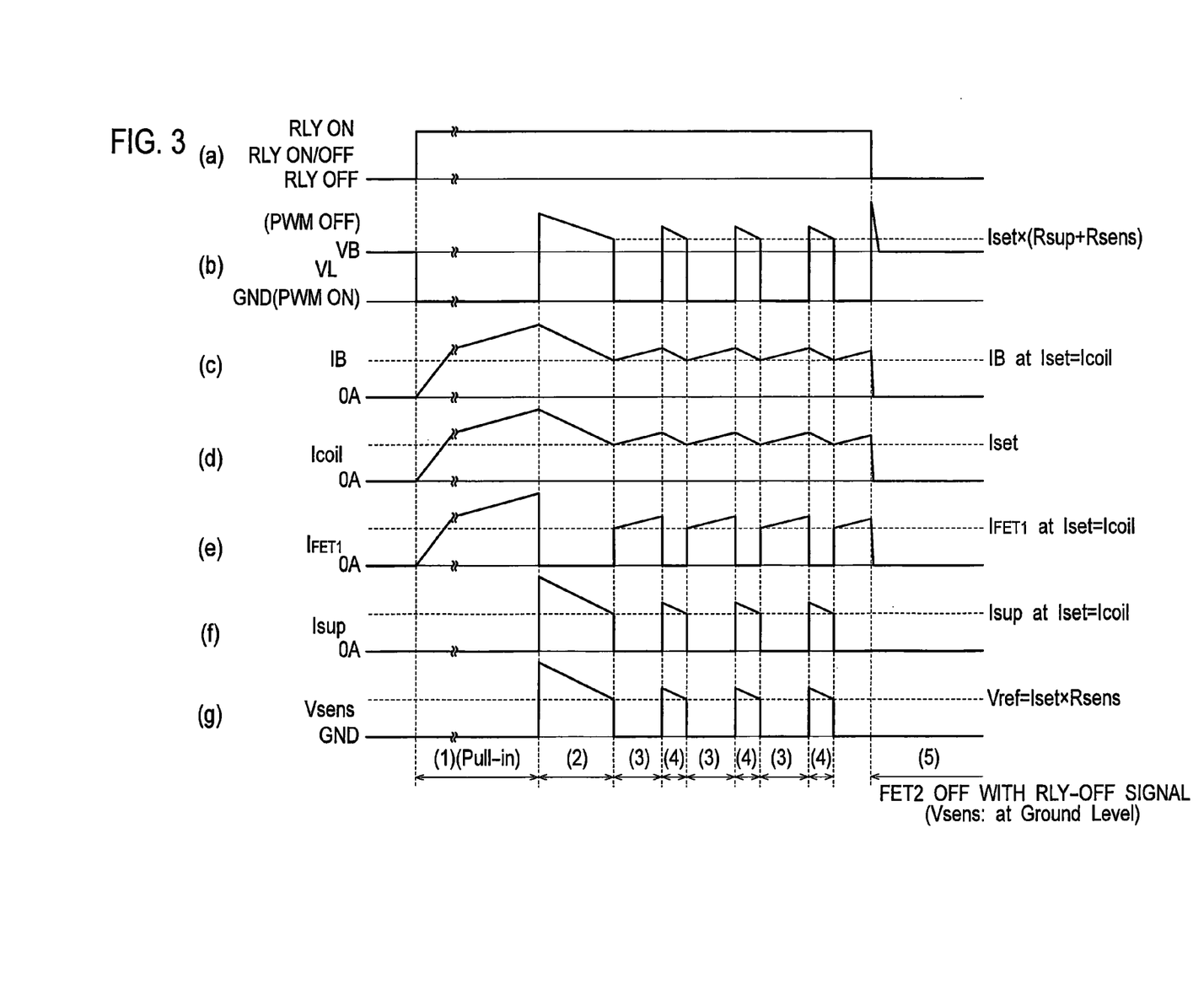
FIG. 3 is a timing chart illustrating potentials, currents and signal conditions at respective points in the relay control device of FIG. 1.

First, with the start of supplying a load (not illustrated) with power from the power source B, when the inputting of the relay ON signal illustrated with the chart (a) of FIG. 3 is started, the DC drive signal (Pull-in) is outputted by the Pull-in circuit 9*a* of the relay drive circuit 9 for a predetermined period (the period (1) in FIG. 3). Thus, the FET1 is turned on and the energization of the relay coil 5*b* is executed for the predetermined period, so that the relay contacts 5*a* is closed certainly.

In addition, when the inputting of the relay ON signal is started, the outputting of the absorption circuit ON signal by the switch drive circuit 11 is started. Consequently, the FET2 is turned on.

Then, in the period (1) in FIG. 3 where the FET1 and the FET2 are both turned on, there is formed a parallel circuit of a circuit extending from the relay coil 5*b* to the ground through the FET1 and a circuit extending from the relay coil 5*b* to the ground through the coil energy absorbing circuit 7. However, since the coil energy absorption circuit 7 (i.e. its coil surge absorption resistor Rsup) has high impedance, the discharge current IB of the power source B will almost flow from the relay coil 5*b* to the ground through the FET1.

Therefore, in the period (1) in FIG. 3, a potential VL at the connection point between the drain of the relay coil 5*b* and the FET1 illustrated in FIG. 1 is lowed from the source voltage VB to the ground potential (GND), as illustrated in the chart (b) of FIG. 3.

In addition, during the output of the DC drive signal by the Pull-in circuit 9*a*, the discharge current IB of the power source B illustrated with the chart (c) of FIG. 3 is elevated from 0 A gradually. Therefore, the current Icoil flowing through the relay coil 5*b* and a current IFET1 flowing between the drain and the source of the FET1 are also elevated from 0 A gradually, as illustrated with the charts (d) and (e) of FIG. 3, as well as the discharge current IB.

When the output of the DC drive signal is completed with an elapse of the predetermined period since the output of the DC drive signal was started, the FET1 is turned off (i.e. period (2) in FIG. 3). Then, by the surge voltage generated in the relay coil 5*b* with the FET1 inactivated, the potential VL at the connection point between the relay coil 5*b* and the drain of the FET1 is elevated higher than the source voltage VB, as illustrated with the chart (b) of FIG. 3.

After completing the output of the DC drive signal, the regenerative current flows from the relay coil 5*b* to the ground through the coil energy absorption circuit 7. This regenerative current gradually decreases as time passed since the completion of outputting the DC drive signal (i.e. period (2) in FIG. 3). Therefore, the discharge current IB of the power source B, the current IFET1 flowing between the drain and the source of the FET1, and the current Isup flowing through the coil surge absorption resistance Rsup of the coil energy absorption circuit 7, which are illustrated with the charts (c), (e), and (f) of FIG. 3 respectively, all decrease gradually as the regenerative current does decrease.

Then, the current Icoil flowing through the relay coil 5b, which is illustrated with the chart (d) of FIG. 3, decreases to the minimum drive current Iset and the potential Vsens of the current detection resistor Rsens, which is illustrated with the chart (g) of FIG. 3, decreases to the reference potential Vref (=Iset×Rsens). Consequently, the PWM generating part 9b of the relay drive circuit 9 outputs the PWM drive signal for the period corresponding to the on-duty of the PWM control (i.e. period (3) in FIG. 3).

In the period (3) in FIG. 3, both the FET1 and the FET2 are turned on to form a parallel circuit of a circuit extending from the relay coil 5b to the ground through the FET1 and a circuit extending from the relay coil 5b to the ground through the coil energy absorbing circuit 7. However, since the coil energy absorption circuit 7 (its coil surge absorption resistor Rsup) has high impedance, the discharge current IB of the power source B will almost from the relay coil 5b to the ground through the FET1.

Therefore, in the period (3) in FIG. 3, the potential VL at the connection point between the relay coil 5b and the drain of the FET1 drops from a potential higher than the source voltage VB to the ground potential (GND), as illustrated with the chart (b) of FIG. 3.

Also, during the output of the PWM drive signal by the PWM generating part 9b (i.e. on-duty period of PWM control), the discharge current IB of the power source B illustrated with the chart (c) in FIG. 3 is gradually elevated from a current value when the current Icoil flowing through the relay coil 5b is the minimum drive current Iset. Therefore, the current Icoil flowing through the relay coil 5b gradually rises from the minimum drive current Iset, as illustrated with the chart (d) of FIG. 3. Similarly, the current IFET1 flowing between the drain and the source of the FET1 also gradually increases from a current value when the current Icoil flowing through the relay coil 5b is the minimum drive current Iset, as illustrated with the chart (e) of FIG. 3.

When the output of the PWM drive signal (i.e. on-duty period in PWM control) is completed with an elapse of the predetermined period since the output of the PWM drive signal was started, the FET1 is turned off (i.e. period (4) in FIG. 3). Then, by the surge voltage generated in the relay coil 5b with the FET1 inactivated, the potential VL at the connection point between the relay coil 5b and the drain of the FET1 is elevated higher than the source voltage VB, as illustrated with the chart (b) of FIG. 3.

Also, after completing the output of the PWM drive signal, the regenerative current flows from the relay coil 5b to the ground through the coil energy absorption circuit 7. This regenerative current gradually decreases as time passed since the completion of outputting the PWM drive signal (i.e. period (4) in FIG. 3). Therefore, the discharge current IB of the power source B, the current IFET1 flowing between the drain and the source of the FET1, and the current Isup flowing through the coil surge absorption resistance Rsup of the coil energy absorption circuit 7, which are illustrated with the charts (c), (e), and (f) of FIG. 3 respectively, all decrease gradually as the regenerative current does decrease.

Then, the current Icoil flowing through the relay coil 5b, which is illustrated with the chart (d) of FIG. 3, decreases to the minimum drive current Iset and the potential Vsens of the current detection resistor Rsens, which is illustrated with the chart (g) of FIG. 3, decreases to the reference potential Vref. Consequently, the PWM generating part 9b of the relay drive circuit 9 outputs the PWM drive signal for the period corresponding to the on-duty of the PWM control (i.e. period (3) in FIG. 3) again. Then, the operations of the period (3) and the period (4) in FIG. 3 are repeated.

With the completion of supplying the load (not illustrated) with the power from the power source B, meanwhile, when the inputting of the relay ON signal is completed as illustrated with the chart (a) in FIG. 3, the outputting of the PWM drive signal by the PWM generating part 9b of the relay drive circuit 9 and the outputting of the absorbing circuit ON signal by the switch drive circuit 11 are together completed, so that both the FET1 and the FET2 are turned off.

Correspondingly, the potential VL at the connection point between the relay coil 5b and the drain of the FET1 once rises to the surge voltage and subsequently drops to the source voltage VB for stabilization, as illustrated with the chart (b) of FIG. 3. Additionally, the discharge current IB of the power source B, the current Icoil flowing through the relay coil 5b, the current IFET1 flowing between the drain and the source of the FET1, and the current Isup flowing through the coil surge absorption resistor Rsup of the coil energy absorption circuit 7, which are illustrated with the charts (c) to (f) of FIG. 3 respectively, all become 0 A. In addition, the potential Vsens of the current detection resistor Rsens illustrated with the chart (g) of FIG. 3 becomes the ground potential (these are various events occurring in the period (5) in FIG. 3).

Figure 4:
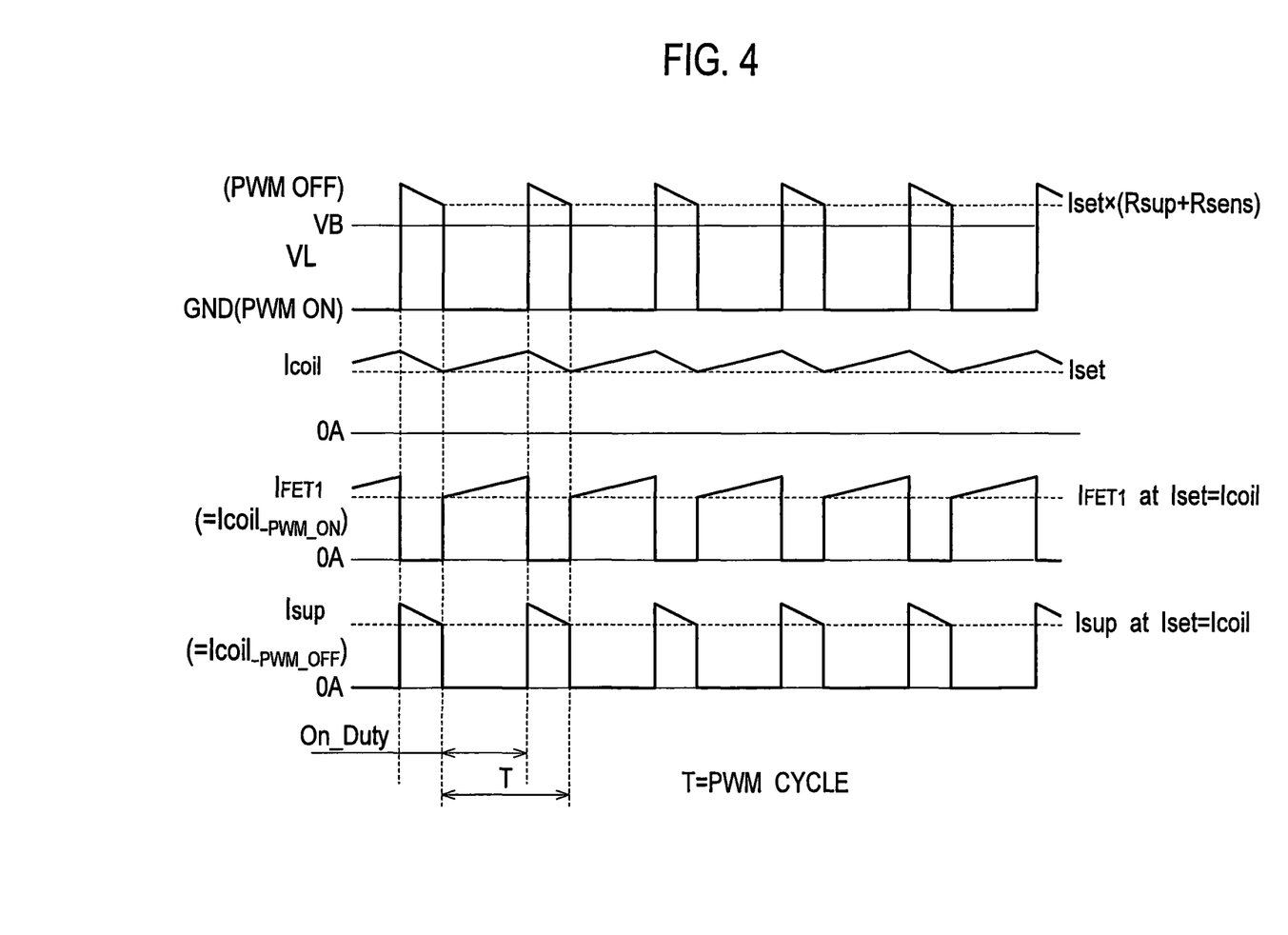
FIG. 4 is an explanatory diagram about the power consumption at respective points in the relay control device of FIG. 1.

Next, the power consumption of the relay control device 1 according to the embodiment will be described with reference to the explanatory diagram of FIG. 4.

In the relay control device 1, the relay coil 5b, the coil energy absorption circuit 7, and the FET1 consume power exclusively. In particular, the relay coil 5b and the coil energy absorption circuit 7 consume power even in the off-duty period of PWM control. Therefore, the power consumption will be described with respect to each power consumption element.

(Power Consumption of Relay Coil 5b)

The power consumption Pcoil of the relay coil 5b is obtained by the following calculating equation:

$$P\text{coil}=I\text{coil}^2 \times R\text{coil}.$$

(Power Consumption of Coil Energy Absorption Circuit 7)

The coil energy absorption circuit 7 consumes the power of Pabsorb=Psup+PFET2+Psens in the off-duty period (=1−ON_Duty) of PWM control when the regenerative current does flow. Then, as the current Icoil flowing through the relay coil 5b is equal to the current Isup flowing through the coil surge absorption resistance Rsup in the off-duty period of PWM control, there are established the following equations:

$$P\text{sup}=I\text{sup}^2 \times R\text{sup} \times (1-\text{ON\_Duty}) = I\text{coil}^2 \times R\text{sup} \times (1-\text{ON\_Duty}),$$

$$P\text{FET2}=I\text{sup}^2 \times R\text{FET2} \times (1-\text{ON\_Duty}) = I\text{coil}^2 \times R\text{FET2} \times (1-\text{ON\_Duty}),$$

$$P\text{sens}=I\text{sup}^2 \times R\text{sens} \times (1-\text{ON\_Duty}) = I\text{coil}^2 \times R\text{sens} \times (1-\text{ON\_Duty}).$$

(Power Consumption of FET1)
In the on-duty period (=ON_Duty) of PWM control, the FET1 consumes the power of:

PFET1=Pt1+Pt2+Pt3.

Figure 5:
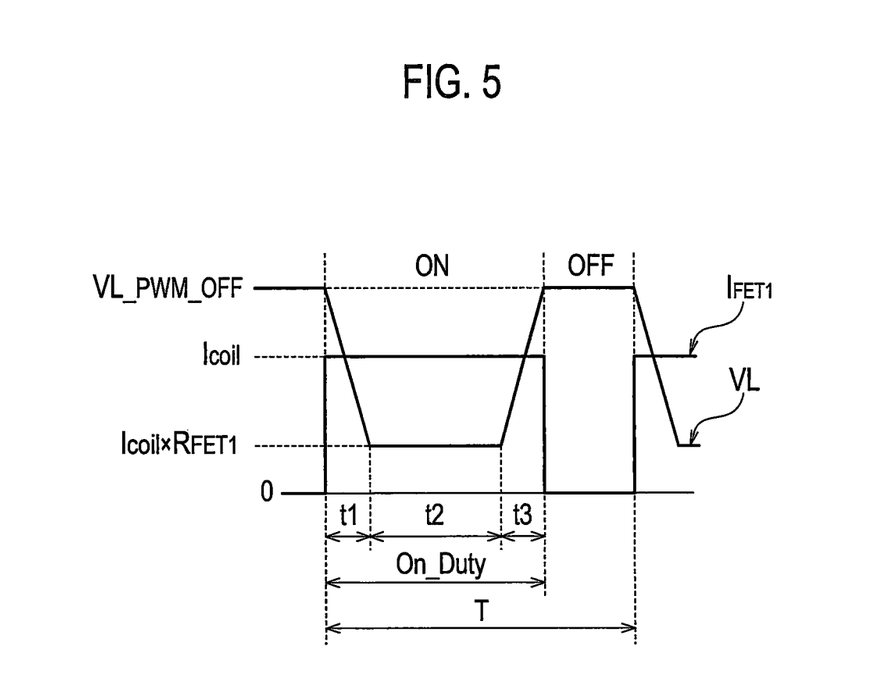
FIG. 5 is an explanatory diagram illustrating a segment for calculating the power consumption of the relay control device of FIG. 1 in an on-duty period of PWM control.

Here, t1 to t3 designate respective segments obtained by dividing the on-duty period of PWM control into three successive segments, as illustrated in FIG. 5.

In the on-duty period of PWM control, the current IFET1 flowing between the drain and the source of the FET1 varies between 0 A and the current Icoil flowing through the relay coil 5b, in a square-wave manner.

On the other hand, the potential VL at the connection point between the relay coil 5b and the drain of the FET1 decreases from the potential VL_PWM_OFF of the off-duty period of PWM control to the potential in the on-duty period of the PWM control, in the segment of t1 since a transition from the off-duty period to the on-duty period.

Also, the potential VL at the connection point becomes constant in the segment t2 following the segment t1, while the potential VL at the connection point increases in the subsequent segment t3 to a transition from the on-duty period to the off-duty period of PWM control. Thus, the power consumption of the relay drive circuit 9 is calculated with respect to each segment t1 to t3, separately.

(Power Consumption of the FET1 in Segment t1)
In the segment t1, the potential VL at the connection point decreases from the potential VL_PWM_OFF of the off-duty period of PWM control to the potential of the on-duty period of PWM control. Here, the potential of the on-duty period of PWM control can be represented by IFET1×RFET1 (on-resistance of the FET1).

Therefore, the power consumption Pt1 of the FET1 in the segment t1 is calculated by multiplying the ratio of the segment t1 to the cycle T of PWM control (t1/T) by a half of value obtained by multiplying the current IFET1 flowing through the FET1 by the potential difference between the off-duty period and the on-duty period of the PWM control, that is, the following calculating equation:

Pt1=0.5×IFET1×(VL_PWM_OFF−IFET1×RFET1)×(t1/T)

where there is a relationship of t1<<T.

Then, in the on-duty period of PWM control, the current IFET1 flowing between the drain and the source of FET1 becomes equal to the current Icoil flowing through the relay coil 5b. In addition, the potential VL_PWM_OFF of the off-duty period of PWM control is defined by the current Icoil flowing through the relay coil 5b and the value of resistance of the switch drive circuit 11 (=Rsup+RFET2+Rsens).

For this reason, the power consumption Pt1 of the FET1 in the segment t1 will be as follows:

Pt1=0.5×Icoil2×(Rsup+RFET2+Rsens−RFET1)×(t1/T)

where there is a relationship of t1<<T.　　　(a)

In connection, it is noted that in the on-duty period of PWM control (i.e. period (3) in FIG. 3), the current Icoil flowing through the relay coil 5b increases as illustrated with the chart (d) of FIG. 3. In order to simplify the calculation of the power consumption Pt1 of the FET1 in the segment t1, however, it is assumed here that the current Icoil flowing through the relay coil 5b in the on-duty period of PWM control is constant.

Further, in the off-duty period of PWM control (i.e. periods (2) and (4) in FIG. 3), the potential VL_PWM_OFF at the connection point between the relay coil 5b and the drain of the FET1 decreases as illustrated with the chart (d) of FIG. 3. In order to simplify the calculation of the power consumption Ptl of the FET1 in the segment t1, however, it is assumed here that the potential VL_PWM_OFF of the connection point in the off-duty period of PWM control is constant.

Also, the above assumptions of regarding the current Icoil flowing through the relay coil 5b in the on-duty period of PWM control and the potential VL_PWM_OFF at the connection point in the off-duty period of PWM control as being constant are applied to even the later-mentioned calculation of the power consumptions Pt2 and Pt3 of the FET1 in the segments t2 and t3, similarly.

(Power Consumption of FET1 in Segment t2)
Next, with the use of the current IFET1 flowing between the drain and the source of the FET1 in the segment t2, the on-resistance RFET1 of FET1, and the ratio of the segment t2 to the cycle T of PWM control (t2/T), the power consumption Pt2 of the FET1 in the segment t2 is calculated by the following calculating equation:

$$Pt2 = 0.5 \times IFET1^2 \times RFET1 \times (t2/T), \text{ where } t2 \ll T \quad (b)$$

$$= 0.5 \times Icoil^2 \times RFET1 \times (t2/T), \text{ where } t2 \ll T$$

(in the on-duty period of PWM control, the power consumption is obtained by the equation of: IFET1=Icoil).

(Power Consumption of FET1 in Segment t3)
In the segment t3, as opposed to the segment t1, the potential VL at the connection point increases from the potential IFET1×RFET1 (=Icoil×RFET1) in the on-duty period of PWM control to the potential VL_PWM_OFF in the off-duty period of PWM control.

For this reason, the power consumption Pt3 of the FET1 in the segment t3 is calculated by the following equation, similarly to the power consumption Ptl of the relay drive circuit 9 in the segment t1:

Pt3=0.5×Icoil²×(Rsup+RFET2+Rsens−RFET1)×(t3/T), where there is a relationship of t3<<T　　　(c).

Then, both the on-resistance RFET2 of the FET2 and the on-resistance RFET1 of the FET1 in the equations (a) to (c) are remarkably small in comparison with the coil surge suppression resistor Rsup or the current detection resistor Rsens of the coil energy absorption circuit 7. In the relay control device 1, therefore, both the coil surge absorption resistance Rsup and the current detection resistor Rsens consume most of the power.

As described above, the relay control device 1 according to the embodiment is constructed so that the regenerative current from the relay coil 5b flows toward the ground through the coil energy absorbing circuit 7 connected to the lower side of the relay coil 5b. Further, the current detection resistor Rsens as a shunt resistor is connected to the ground side of the coil surge absorption resistor Rsup of the coil energy absorption circuit 7 so that the current detection circuit 13 compares the potential Vsens of the resistor with the reference potential Vref. Based on the comparison result of the current detection circuit 13, additionally, the relay control device 1 is also constructed so as to terminate the off-duty period of PWM control before the current Icoil flowing through the relay coil 5b falls below the minimum drive current Iset.

In this way, the surge voltage at the time when the regenerative current arises is once lowered by the coil surge suppression resistor Rsup and subsequently applied to the current detection resistor Rsens as a shunt resistor. In the relay control device 1 according to the embodiment, therefore, it is possible to protect the current detection circuit 13 having its inverting input terminal to which one end of the current detection resistor Rsens (i.e. the potential Vsens) is inputted, from a high voltage exceeding the voltage of the power source B, without providing such a drop circuit as used in the conventional control device.

Additionally, as the coil energy absorption circuit 7 allowing a flowage of the regenerative current is arranged in parallel with theFET1 which is activated in the on-duty period of PWM control to form a discharge path from the power source, it is possible to discharge energy, which has been stored in the relay coil 5b during an activation of the FET1, in the form of the regenerative current during an inactivation of the FET1. For this reason, with the relay control device 1 according to the embodiment, it is possible to eliminate such a high-speed diode as used in conventional control devices and also possible to simplify the constitution for detecting the regenerative current so that the current Icoil flowing through the relay coil 5b would not drop under the minimum drive current Iset, due to the comparison of the potential Vsens of the current detection resistor Rsens with the reference potential Vref.

Additionally, as the power source B keeps on discharging electricity even in the off-duty period of PWM control where the regenerative current flows through the coil energy absorption circuit 7, the regenerative current (i.e. current Icoil flowing through the relay coil 5b in the off-duty period of PWM control) does not include high frequency components raising or lowering the current in a pulsed manner, as illustrated with the chart (d) of FIG. 3. Thus, it is possible to suppress an occurrence of conduction noise caused by the discharge current from the power supply B and also possible to eliminate the need for EMI countermeasure around the power source.

In such an arrangement as the conventional control device where the downstream side of the relay coil is connected to the power source through a high-speed diode and a switching element in series, the regenerative currents flows toward the power source through the high-speed diode and the switching element. Thus, if an FET is used for the switching element, its source potential would get higher than the source voltage. For this reason, in order to produce a potential difference between the gate and the source thereby allowing the regenerative current to flow between the source and the drain, it is necessary to either use a P-channel FET having a reverse bias or bias the gate potential of an N-channel FET with the use of a charge pump, causing the soaring in manufacturing cost of the device.

To this, since the coil energy absorbing circuit 7 is connected to the lower side of the relay coil 5b in the relay control device 1 according to the embodiment, it is possible to set the gate voltage to a lower range in order to produce a potential difference between the gate and the source of the FET2 thereby allowing a flowage of the regenerative current through the FET2. Thus, in the relay control device 1 according to the embodiment, it is possible to form the FET2 by an inexpensive N-channel FET.

In the relay control device 1 according to the embodiment, additionally, most of electrical power is consumed by the coil surge absorption resistor Rsup and the current detection resistor Rsens, and therefore, the power consumption at the FET2 of the coil energy absorbing circuit 7 is insignificant.

For this reason, in the relay control device 1 according to the embodiment, the FET2 can be formed by inexpensive low-power corresponding parts.

On the other hand, if the current of the relay coil is controlled so as not to be less than the minimum drive current with the use of a current mirror circuit, a transistor connected to the relay coil in series to form part of the current minor circuit would consume all electrical power supplied from the power source except the electrical power consumed by the inner relay coil 5b. Accordingly, it is impossible to form a switching element (transistor), which is used to "power save" control the current of the relay coil under PWM control, as a low power-consumption element in an integrated circuit.

Thus, as described above, with the relay control device 1 according to the embodiment where the FET2 can be formed by low-power corresponding parts, multi-channel FET2 can be integrated to configure it in the form of an integrated circuit and therefore, it is possible to miniaturize the device.

Also, although the embodiment has been described with the relay control device 1 for controlling the relay coil 5b as an example, the invention is not limited only to this embodiment but is broadly applicable to an arrangement for controlling an electrical load where electromagnetic induction is induced by its energization such as an electromagnetic clutch.

What is claimed is:

1. An electromagnetic inductive load control device for PWM-controlling power supply to an electromagnetic inductive load by performing ON and OFF control of a PWM-control switching element connected to a lower side of the electromagnetic inductive load to which electrical power from a power source is supplied, comprising:
    a series circuit having a surge-voltage absorption resistor and a regenerative-current detection resistor, the series circuit being connected to the lower side of the electromagnetic inductive load in parallel with the PWM-control switching element and allowing regenerative current to flow through the surge-voltage absorption resistor and the regenerative-current detection resistor in series;
    a regenerative-current control switching element connected in series with a point of the series circuit through which the regenerative current passing through at least the surge-current detection resistor flows; and
    a drive circuit that turns on the regenerative-current control switching element while supplying the electromagnetic inductive load with the electrical power and that turns off the regenerative-current control switching element with the completion of supplying the electromagnetic inductive load with the electrical power.

2. The electromagnetic inductive load control device of claim 1, wherein
    the electromagnetic inductive load is a relay coil provided in a relay, and
    the drive circuit is configured to turn on the regenerative-current control switching element synchronously with a power-on period by a DC-drive circuit of the PWM-control switching element when the relay is turned on with the start of supplying the electromagnetic inductive load with the electrical power and to turn off the regenerative-current control switching element synchronously with the PWM-control switching element turning off when the relay is turned off with the completion of supplying the electromagnetic inductive load with the electrical power.

* * * * *